(12) United States Patent
Barry et al.

(10) Patent No.: US 10,962,611 B2
(45) Date of Patent: Mar. 30, 2021

(54) MICROWAVE RESONATOR READOUT OF AN ENSEMBLE SOLID STATE SPIN SENSOR

(71) Applicant: Massachusetts Institute of Technology, Cambridge, MA (US)

(72) Inventors: John F. Barry, Cambridge, MA (US); Erik R. Eisenach, Cambridge, MA (US); Michael F. O'Keeffe, Medford, MA (US); Jonah A. Majumder, Cambridge, MA (US); Linh M. Pham, Arlington, MA (US); Isaac Chuang, Lexington, MA (US); Erik M. Thompson, Waltham, MA (US); Christopher Louis Panuski, Somerville, MA (US); Xingyu Zhang, Cambridge, MA (US); Danielle A. Braje, Winchester, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 7 days.

(21) Appl. No.: 16/551,799

(22) Filed: Aug. 27, 2019

(65) Prior Publication Data
US 2020/0064419 A1 Feb. 27, 2020

Related U.S. Application Data

(60) Provisional application No. 62/723,113, filed on Aug. 27, 2018.

(51) Int. Cl.
*G01V 3/00* (2006.01)
*G01R 33/12* (2006.01)
(Continued)

(52) U.S. Cl.
CPC ........ *G01R 33/1284* (2013.01); *G01R 33/26* (2013.01); *G01R 33/323* (2013.01)

(58) Field of Classification Search
CPC .............. G01R 33/3415; G01R 33/543; G01R 33/5659; G01R 33/36; A61B 5/055
(Continued)

(56) References Cited

U.S. PATENT DOCUMENTS

| 7,042,216 B2 * | 5/2006 | Barbic | G01R 33/5604 324/307 |
| 9,766,181 B2 | 9/2017 | Englund et al. | |

(Continued)

FOREIGN PATENT DOCUMENTS

WO 2018126293 A1 7/2018

OTHER PUBLICATIONS

International Search Report and Written Opinion in International Patent Application No. PCT/US2019/048238 dated Dec. 23, 2019.
(Continued)

*Primary Examiner* — Walter L Lindsay, Jr.
(74) *Attorney, Agent, or Firm* — Smith Baluch LLP

(57) ABSTRACT

Microwave resonator readout of the cavity-spin interaction between a spin defect center ensemble and a microwave resonator yields fidelities that are orders of magnitude higher than is possible with optical readouts. In microwave resonator readout, microwave photons probe a microwave resonator coupled to a spin defect center ensemble subjected to a physical parameter to be measured. The physical parameter shifts the spin defect centers' resonances, which in turn change the dispersion and/or absorption of the microwave resonator. The microwave photons probe these dispersion and/or absorption changes, yielding a measurement with higher visibility, lower shot noise, better sensitivity, and higher signal-to-noise ratio than a comparable fluorescence measurement. In addition, microwave resonator readout
(Continued)

enables coherent averaging of spin defect center ensembles and is compatible with spin systems other than nitrogen vacancies in diamond.

22 Claims, 11 Drawing Sheets

(51) Int. Cl.
*G01R 33/32* (2006.01)
*G01R 33/26* (2006.01)

(58) Field of Classification Search
USPC .......................................................... 324/309
See application file for complete search history.

(56) References Cited

U.S. PATENT DOCUMENTS

| 10,197,515 | B2 | 2/2019 | Clevenson et al. |
|---|---|---|---|
| 2005/0016276 | A1 | 1/2005 | Guan et al. |
| 2011/0192226 | A1 | 8/2011 | Hayner et al. |
| 2012/0051996 | A1 | 3/2012 | Scarsbrook et al. |
| 2013/0050675 | A1 | 2/2013 | Jansen et al. |
| 2015/0192532 | A1 | 7/2015 | Clevenson et al. |
| 2015/0358026 | A1 | 12/2015 | Gan |
| 2016/0356863 | A1 | 12/2016 | Boesch et al. |
| 2017/0010338 | A1 | 1/2017 | Bayat et al. |
| 2017/0302004 | A1 | 10/2017 | Stevenson et al. |
| 2017/0328965 | A1 | 11/2017 | Hruby et al. |
| 2017/0370979 | A1 | 12/2017 | Braje et al. |
| 2018/0136291 | A1 | 5/2018 | Pham et al. |
| 2018/0364165 | A1* | 12/2018 | Barry .................... G01R 33/00 |
| 2019/0178958 | A1 | 6/2019 | Barry et al. |
| 2019/0219527 | A1 | 7/2019 | Kim et al. |
| 2019/0235031 | A1 | 8/2019 | Ibrahim et al. |

OTHER PUBLICATIONS

Barry et al., "Optical magnetic detection of single-neuron action potentials using quantum defects in diamond." Proceedings of the National Academy of Sciences 113.49 (2016): 14133-14138.
Le Sage et al., "Efficient photon detection from color centers in a diamond optical waveguide." Physical Review B 85.12 (2012): 121202. 4 pages.
Wolf et al.,"Subpicotesla diamond magnetometry." Physical Review X 5.4 (2015): 041001. 10 pages.

* cited by examiner

MICROWAVE RESONATOR READOUT OF AN ENSEMBLE SOLID STATE SPIN SENSOR

CROSS-REFERENCE TO RELATED APPLICATION(S)

This application claims the priority benefit, under 35 U.S.C. 119(e), of U.S. Application No. 62/723,113, filed on Aug. 27, 2018, which is incorporated herein by reference in its entirety.

GOVERNMENT SUPPORT

This invention was made with Government support under Grant No. FA8702-15-D-0001 awarded by the U.S. Air Force. The Government has certain rights in the invention.

BACKGROUND

Solid-state spin sensors employ spin center defects, including color center defects, in a solid-state host to measure one or more physical parameters or quantities, such as magnetic field, electric field, temperature, pressure, or the presence of an atomic, molecular, or other hadronic species. The spin center defects are point-like defects inside the solid-state host, such as nitrogen vacancies (NVs) in diamond, that sense the physical quantity. Their quantum spin states can be manipulated by optical excitation and microwave radiation, making the quantum spin states sensitive to the physical parameter(s).

A conventional solid-state spin sensor operates as follows. One or more color center defects within the solid-state spin sensor are illuminated by optical excitation radiation from an optical radiation source. Illumination with the optical excitation radiation causes the color center defects to emit fluorescent light, which is collected by a light sensor. The application of the optical excitation radiation to the color center defects may be accompanied by application of microwave radiation to the color center defects. In some implementations, the microwave radiation is used to manipulate the population distribution between the quantum energy levels (quantum spin states) of the color center defects.

The optical excitation radiation and the microwave radiation may be applied simultaneously, sequentially, or both simultaneously and sequentially. The application of the optical and microwave radiation to the solid-state spin sensor is arranged so that information pertaining to the physical quantity to be measured is encoded in emitted fluorescent light. For example, if a diamond containing nitrogen-vacancy color center defects is illuminated with green light (light at a wavelength of 495-570 nm) and appropriate microwave radiation, the diamond may emit red fluorescent light (light at a wavelength of 630-850 nm) that encodes the distribution of the spin center defect population among the quantum spin states. This population distribution depends in turn on the physical parameter applied to the spin center defects. Thus, the detected fluorescence represents the physical quantity experienced by the spin center defects. When the physical parameter is a magnetic field, this fluorescence-based measurement is called an optically detected magnetic resonance (ODMR) measurement.

FIG. 1 shows a standard solid-state spin sensor system 100 with a solid-state spin sensor 110 (e.g., spin center defects, such as nitrogen vacancies, in a solid-state host, such as bulk diamond), microwave radiation source 120, optical radiation source 130, photodetector 140, and processor 160 (e.g., in a computer). In operation, the microwave radiation source 120 and optical radiation source 130 apply microwave radiation and optical excitation radiation, respectively, to the solid-state spin sensor 110. The microwave radiation and the optical excitation radiation may each be turned on or off by a corresponding switch 122, 132, which may be controlled by the processor 160. The processor 160 may also control aspects of the microwave radiation and the optical excitation radiation, such as the power and spectral content.

When excited by the optical excitation radiation, the color center defects in the solid-state spin sensor 110 emit fluorescent light 111, which is collected and sent to the photodetector 140. The photodetector's output, which represents the intensity of the fluorescent light 111 impinging on the photodetector 140, is digitized by an analog-to-digital converter 142 and sent to the processor 160. The processor 160 uses the known temporal and spectral properties of the applied microwave radiation and optical excitation radiation, along with the intensity of the detected optical fluorescent light, to calculate the value of the physical quantity exerted on the solid-state spin sensor 110.

SUMMARY

Unfortunately, reading out a solid-state spin sensor using fluorescent light described above has a fundamental drawback: determining the quantum states of the spin center defects using the fluorescent light can be highly inefficient. With fluorescence-based readout, most information about the physical parameter being measured (which is encoded in the quantum states of the spin center defects) is lost in the process of reading out the quantum states. The amount of information lost during readout is quantified by the readout fidelity F. For F=1, no information is lost, and the readout fidelity cannot be improved beyond the spin projection limit. For a readout fidelity of F=0.1, 90% of information is lost. For a readout fidelity of F=0.01, 99% of information is lost. Readout fidelities for solid state spin sensors employing the fluorescence-based readout vary from F=0.0002 to F=0.013, indicating an information loss of 98.7% at best.

Readout fidelity also affects measurement time. Generally, the time it takes a solid-state spin sensor to achieve a given signal-to-noise ratio (SNR) is proportional to $F^2$, which means that smaller fidelities translate to longer measurement times for a given SNR. In other words, the measurement time to achieve a given SNR scales as $1/F^2$. This makes the low readout fidelities (F<<1) of fluorescence-based spin-center-defect measurements highly disadvantageous for measuring transient physical quantities with relatively high SNR.

In contrast, an inventive solid-state spin sensor system can operate with a readout fidelity approaching F=1 using a microwave resonator readout technique. This readout fidelity is approximately 100 times better than the readout fidelity for optical readout, which translates to a 100-fold increase in SNR and a 10,000-fold reduction in readout time to achieve a given SNR. To achieve this readout fidelity, an inventive solid-state spin sensor system determines the quantum states of the spin center defects by examining the characteristics of microwave radiation that interacts with the solid-state spin sensor. The interaction of the input microwave radiation with the spin center defects is enhanced by the use of a resonant microwave cavity. For a solid-state spin sensor based on nitrogen vacancies (NVs) in diamond, this microwave resonator readout can be used to determine the magnetic-field dependent Zeeman resonances. By determining the location of the magnetic-field dependent Zeeman resonances, the inventive solid-state spin sensor can function as a magnetometer. Such a magnetometer can be used for applications in bio-sensing, neuroscience, geo-surveying, all-magnetic navigation, magnetic anomaly detection and other applications.

An inventive sensor system may include a microwave resonator, a solid-state host electromagnetically coupled to the microwave resonator and containing spin defect centers, a microwave radiation source in electromagnetic communication with the microwave resonator and the spin defect centers, and a detector in electromagnetic communication with the microwave resonator and the spin defect centers. In operation, the microwave radiation source applies microwave radiation to the microwave resonator and the spin defect centers. The microwave resonator enhances the interaction between the microwave radiation and the spin defect centers. And the detector measures an amplitude and/or a phase of the microwave radiation exiting the microwave resonator after interacting with the spin defect centers.

The detector may be configured to sense a change in the amplitude and/or the phase of the microwave radiation in response to a shift in resonant frequencies of the spin defect centers caused by a physical parameter, such as a magnetic field, applied to the spin defect centers. The detector can be implemented as a homodyne sensor with a reference arm. The detector can also be implemented as a heterodyne detector configured to encode information, at a heterodyne frequency, about a physical parameter that shifts resonance frequencies of the spin defect centers.

The sensor system may also include an optical excitation source (e.g., a laser), in optical communication with the spin defect centers, to excite the spin defect centers to a desired quantum state.

The sensor system can also include a processor, operably coupled to the detector, to determine a physical parameter experienced by the spin defect centers based on the amplitude and/or the phase of the microwave radiation. The microwave radiation source can vary the microwave radiation based on the physical parameter determined by the processor. And the processor can determine quantum states of the spin defect centers based on the amplitude and/or phase of the microwave radiation.

In some cases, the sensor system includes an actuator, operably coupled to the microwave resonator, to vary a resonant frequency of the microwave resonator. The actuator may include a piezo-electric element, varactor, tunable capacitor, or switchable capacitor bank. The actuator can change the resonant frequency of the microwave resonator by varying a capacitance or an inductance. Applying multiple tones to the actuator can cause the microwave resonator to be resonant at multiple frequencies simultaneously. For example, the actuator may comprise a dynamically controlled capacitance configured to allow the microwave resonator to be resonant at multiple frequencies simultaneously.

Microwave resonator readout can be used to measure a physical parameter with a microwave resonator containing a solid-state host. Spin defect centers in the solid-state host are subjected to the physical parameter, which causes a shift in resonance frequencies of the spin defect centers with respect to a resonance frequency of the microwave resonator. A microwave waveform probes the shift in the resonance frequencies of the spin defect centers with respect to the resonance frequency of the microwave resonator. A detector measures the microwave waveform transmitted and/or reflected from the microwave resonator and the spin defect centers. An amplitude and/or a direction of the physical parameter can be determined from the microwave waveform transmitted and/or reflected from the microwave resonator and the spin defect centers.

Measuring the microwave waveform can include measuring in-phase and quadrature components of the microwave waveform. In some cases, measuring the microwave waveform comprises sensing the shift in the resonance frequencies of the spin defect centers with respect to the resonance frequency of the microwave resonator with a contrast ratio of at least 95%. Likewise, determining the amplitude and/or the direction of the physical parameter comprises measuring the physical parameter with a readout fidelity of at least 0.1.

If desired, microwave resonator readout can be implement in a magnetic field sensor that includes a resonant circuit, a microwave source in electromagnetic communication with the resonant circuit, a microwave detector in electromagnetic communication with the microwave resonator, and a processor operably coupled to the microwave detector. The resonant circuit includes a microwave resonator and a solid-state host in proximity to the microwave resonator. This solid-state host has spin defect centers that shift a resonance frequency of the microwave resonator in response to an external magnetic field, which may change a population distribution of the spin defect centers among different quantum states. The microwave source probes the resonance frequency of the microwave resonator with microwave radiation, and the microwave detector detects the microwave radiation that probes the resonance frequency of the microwave resonator. The processor determines a magnitude and/or a direction of the magnetic field based on the microwave radiation detected by the detector.

In some cases, the microwave detector is configured to detect in-phase and quadrature components of the microwave radiation.

The magnetic field sensor may also include locking circuitry, operably coupled to the microwave source and the microwave detector, to lock a spectral component of the microwave radiation to the resonance frequency of the microwave resonator.

BRIEF DESCRIPTIONS OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

DETAILED DESCRIPTION

An inventive solid-state spin sensor system encodes a physical quantity in the phase or amplitude of microwave radiation that has interacted with spin center defects within a solid-state spin sensor. Encoding the physical quantity in the phase and/or amplitude of microwave radiation, instead of optical radiation, greatly enhances the readout fidelity of and sensitivity of bulk-ensemble solid state spin sensors to physical parameters of interest and, as an all-electrical readout mechanism, may be preferable to all-optical readout mechanisms. The solid-state spin sensor system is also more compatible with standard semiconductor process manufacturing than devices employing all-optical readout mechanisms. And thanks to microwave resonator readout, an inventive solid-state spin sensor system can work well with many more types of spin defects, including almost any paramagnetic spin defect, than are compatible with optical readout.

Differences Between Optical Readout and Microwave Resonator Readout

Figure 1:
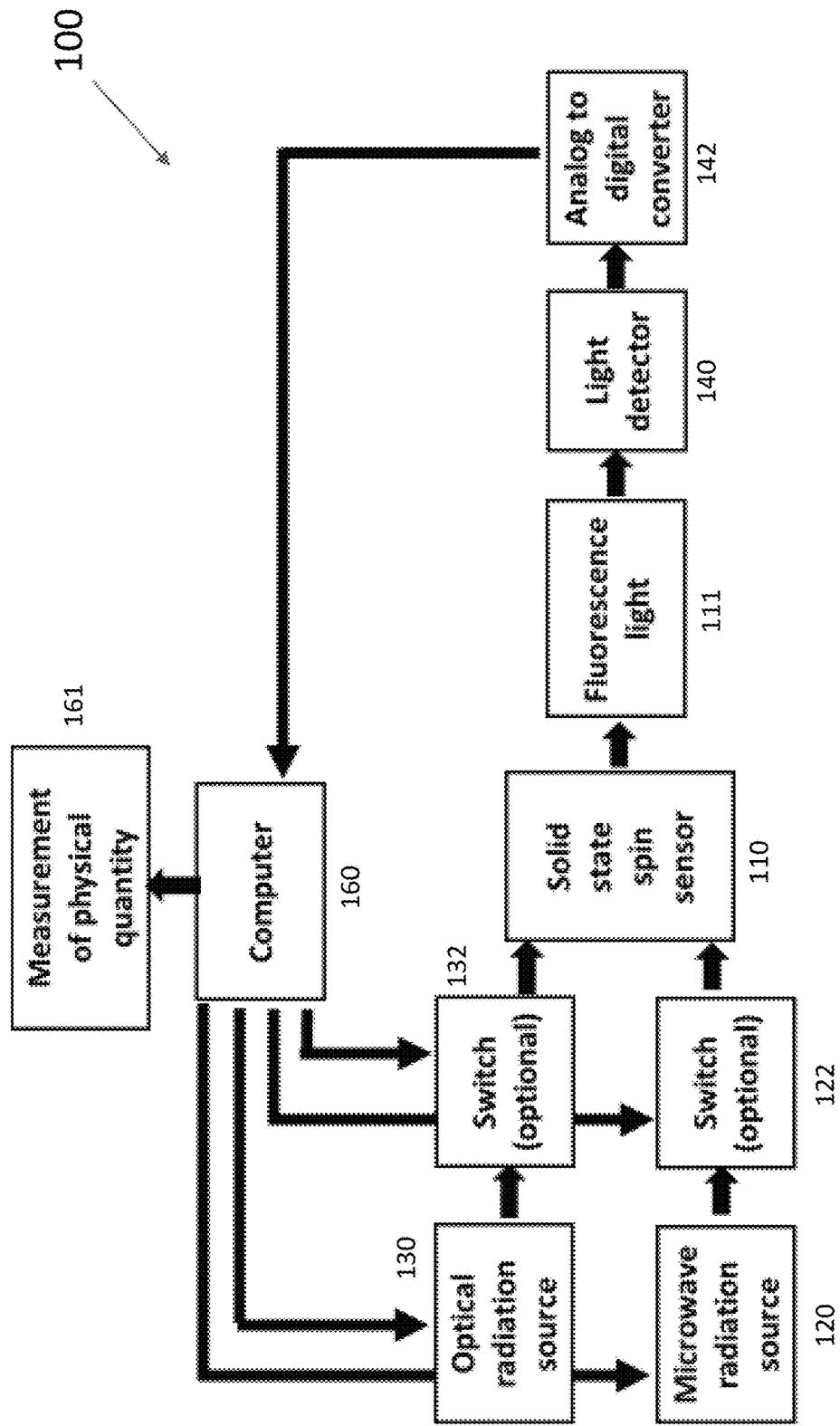
FIG. 1 shows a typical standard solid-state spin sensor with optical readout.
Figure 2B:
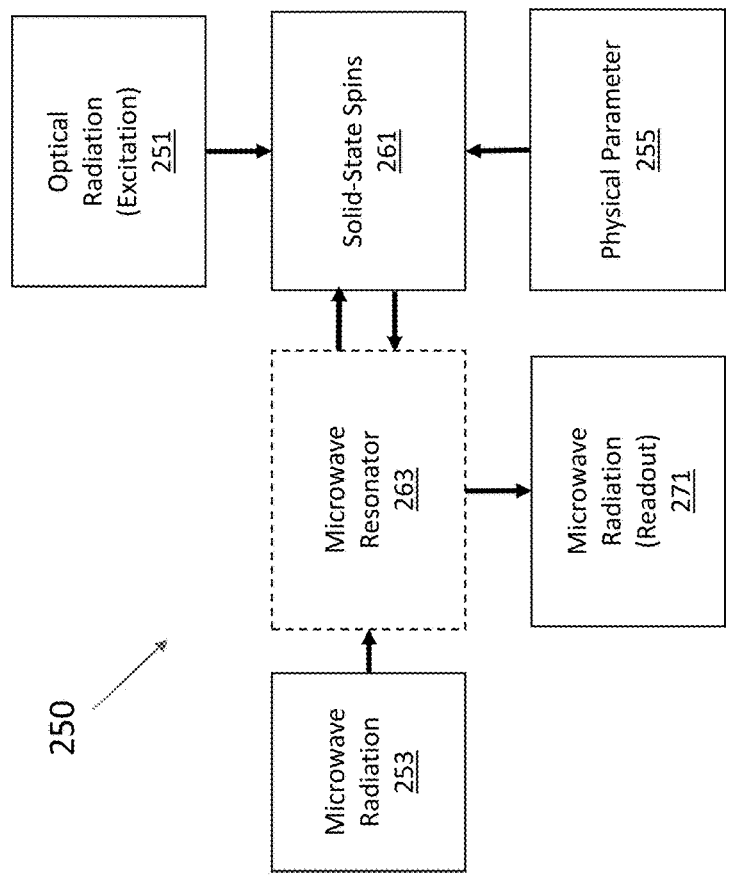
FIG. 2B illustrates microwave resonator readout with a solid-state spin sensor.
Figure 2A:
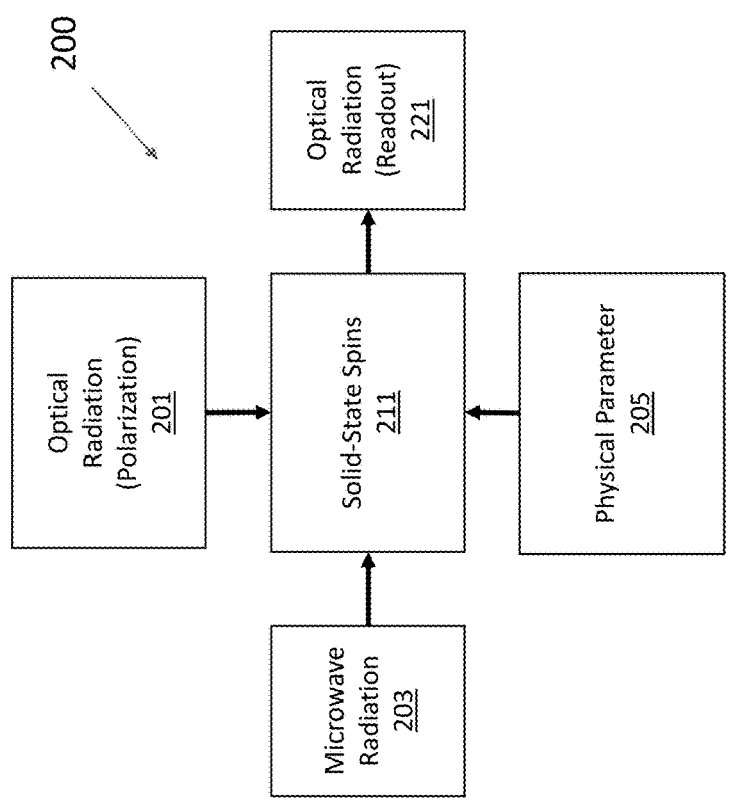
FIG. 2A illustrates optical readout with a solid-state spin sensor.

FIGS. 2A and 2B illustrate how microwave resonator readout differs from optical readout in a solid-state spin sensor. FIG. 2A illustrates conventional optical readout 200. Optical radiation 201 and microwave radiation 203 are applied to solid-state spins 211 of color center defects in a crystalline host, placing the ensemble or population of solid-state spins 211 in a desired quantum state distribution. A physical parameter 205 measured by the sensor, such as magnetic field, electric field, pressure, or temperature, changes the relative populations in different quantum states of the solid-state spins 211. The change in the relative populations of the solid-state spins is reflected in different amounts of photoluminescence 221 emitted by the solid-state spins 211. The changes in photoluminescence 221 can be detected with a fidelity of about 0.01 at best.

FIG. 2B illustrates microwave resonator readout 250 of a solid-state spin sensor. Input microwave radiation 253 and optical radiation 251 are applied to the solid-state spins 261 via a microwave resonator 263, polarizing the solid-state spins 261. The physical parameter 255 being measured changes the relative populations in different quantum states (and the resonance frequencies) of the solid-state spins 261. The change in the population distribution of the solid-state spins 261 changes the resonance frequency or the quality factor of the microwave resonator 263. The change in resonance frequency or quality factor produces a change in microwave radiation 271 transmitted or reflected by the microwave resonator 263 that can be measured with a fidelity of at least 0.1 (e.g., 0.10, 0.20, 0.30, 0.40, 0.50, 0.60, 0.70, 0.75, 0.80, 0.85, 0.90, 0.95, or higher). The contrast ratio for microwave resonator readout 250 can also be quite high, e.g., 50%, 60%, 70%, 80%, 90%, 95%, or higher.

Unlike in the optical readout 200, in the microwave resonator readout 250, the change in the resonant frequencies of the solid-state spins 261 is an intermediate effect; the solid-state spins 261 then change the resonant frequency and/or the quality factor of the microwave resonator, and the phase and/or amplitude of the output microwave radiation reflect the microwave resonator's resonant frequency and/or quality factor.

A Solid-State Spin Sensor System with Microwave Resonator Readout

Figure 3A:
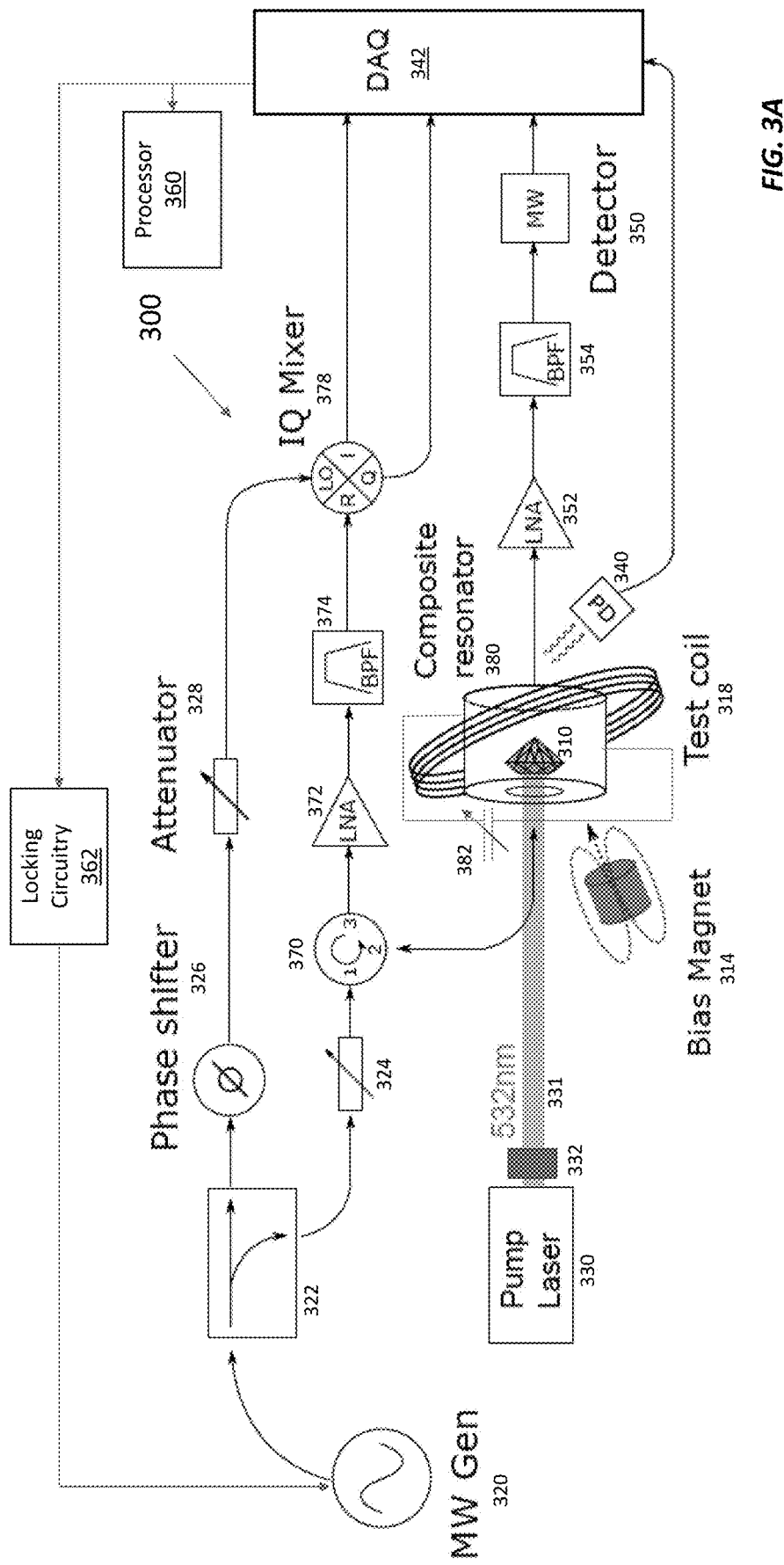
FIG. 3A shows an inventive solid-state spin sensor system with microwave resonator readout.

FIG. 3A shows a solid-state spin sensor system 300 with microwave resonator readout. The solid-state spin sensor system 300 includes a solid-state spin sensor 310, which is a solid-state state host that contains an ensemble of spin center defects, in a microwave cavity defined by a composite microwave resonator 380. Suitable solid-state spin sensors 310 include NVs and silicon vacancies in diamond, divacancies in silicon carbide, and titanium, chromium, manganese, iron, cobalt and nickel defects in sapphire, nickel and cobalt in magnesium oxide. An actuator 382 tunes the resonance frequency of the composite microwave resonator 380. An optional bias magnet 314 applies an optional bias magnetic field to the spin center defects in the solid-state spin sensor 310, splitting the defects' microwave resonances. And an optional test coil 318 can be used to apply a known time-varying magnetic field to the solid-state spin sensor 310 for testing or calibrating the solid-state spin sensor system 300.

The system 300 includes a microwave generator 320, such as a pulse pattern generator, arbitrary waveform generator, direct digital synthesizer, dielectric resonator oscillator, or frequency-multiplied quartz oscillator, that probes the defects' microwave resonances with an input microwave radiation. A microwave splitter 322 coupled to the output of the microwave generator 320 splits the input microwave radiation into a signal arm with a first variable attenuator 324, which is controlled by a processor 360, and a reference arm with a phase shifter 326 and a second variable attenuator 328, which are also controlled by the processor 360 (connections to the processor 360 are omitted for clarity).

A three-port circulator 370 coupled to the first variable attenuator 324 couples the input microwave radiation to the microwave cavity containing the solid-state spin sensor 310 and receives output microwave radiation reflected from the microwave cavity. The circulator 370 couples this output microwave radiation through a first low-noise amplifier (LNA) 372 and first band-pass filter (BPF) 374 to an in-phase/quadrature (I/Q) mixer 378, which mixes the amplified, filtered output microwave radiation with the copy of the input microwave radiation from the reference arm. A data acquisition (DAQ) board 342, which may include one or more analog-to-digital converters (ADCs), receives and digitizes the in-phase and quadrature outputs from the I/Q mixer 378.

The processor 360 is coupled to the DAQ board 342 uses the digitized in-phase and quadrature outputs to compute the physical parameter(s) measured by the system 300 (e.g., the amplitude and orientation of an external magnetic or electric field). The DAQ board 342 may also receive and digitize an output microwave radiation transmitted through the cavity in addition to or instead of the reflected output microwave radiation. This transmitted output microwave radiation is amplified by a second LNA 352, filtered by a second BPF 354, and detected by a microwave detector 350 coupled to the DAQ board 342. (If desired, the microwave detector 350 can be implemented as a dual-channel detector for balanced homodyne or heterodyne detection with a local oscillator provided by an appropriately phase-shifted version of the input microwave radiation.)

Optional locking circuitry 362 coupled to the DAQ board 342 and the microwave generator 320 may lock at least one spectral component (frequency tone) of the input microwave radiation to the resonance frequency of the microwave resonator 380. The locking circuitry 362 generates an error signal that represents changes in resonance frequency or quality factor of the microwave resonator 380 caused by the physical parameter being measured. This error signal may be used to adjust the frequency of the input microwave radiation relative to the resonant frequency of the microwave resonator 380. (Generally, the frequency of the input microwave radiation is kept within a few cavity linewidths of the microwave resonator's resonant frequency.) The error signal can also drive an actuator 382 that changes the resonant frequency of the microwave resonator 380 as explained below. For instance, the locking circuitry 362 can perform the locking with a Pound-Drever-Hall lock, peak dither lock, or another technique to ensure the composite microwave resonator 380 is resonant with one or more tones of the input microwave radiation applied to the cavity. The tone(s) in the input microwave radiation can then be locked to one or more magnetic resonances of the solid-state spin sensor 310.

The system 300 may also include an optional optical radiation source, such as a pump laser 330 that emits a pump beam 331 at a wavelength of 532 nm. An optional modulator 332, such as a shutter or switch, controls whether this pump beam 331 illuminates the solid-state spin sensor 310. The system 300 can also include a photodetector 340, which is coupled to the DAQ board 342, for measuring fluorescent light emitted by the spin center defects in the solid-state spin sensor 310, e.g., for an auxiliary ODMR measurement.

In the system 300 of FIG. 3A, the reflection from the cavity constitutes a homodyne signal that is detected by a homodyne detector in the form of the I/Q mixer 378. For heterodyne detection, the signal in the reference arm or the signal interrogating the cavity (the input microwave radiation) can be modulated with a suitable modulator (e.g., the phase modulator 326). As a result, when the reflected signal (the output microwave radiation) mixes with the signal in the reference arm, the I/Q mixer 378 produces a signal of interest encoded at the modulation frequency. One advantage of full heterodyne detection is that by encoding the signal of interest at a modulation frequency away above DC, the measurement is much less sensitive to 1/f-type noise from the microwave generator 320 and the I/Q mixer 378. (The transmission through the cavity, since there is no mixing, is not a homodyne or heterodyne system.)

Microwave Resonator Design and Construction

Figure 3B:
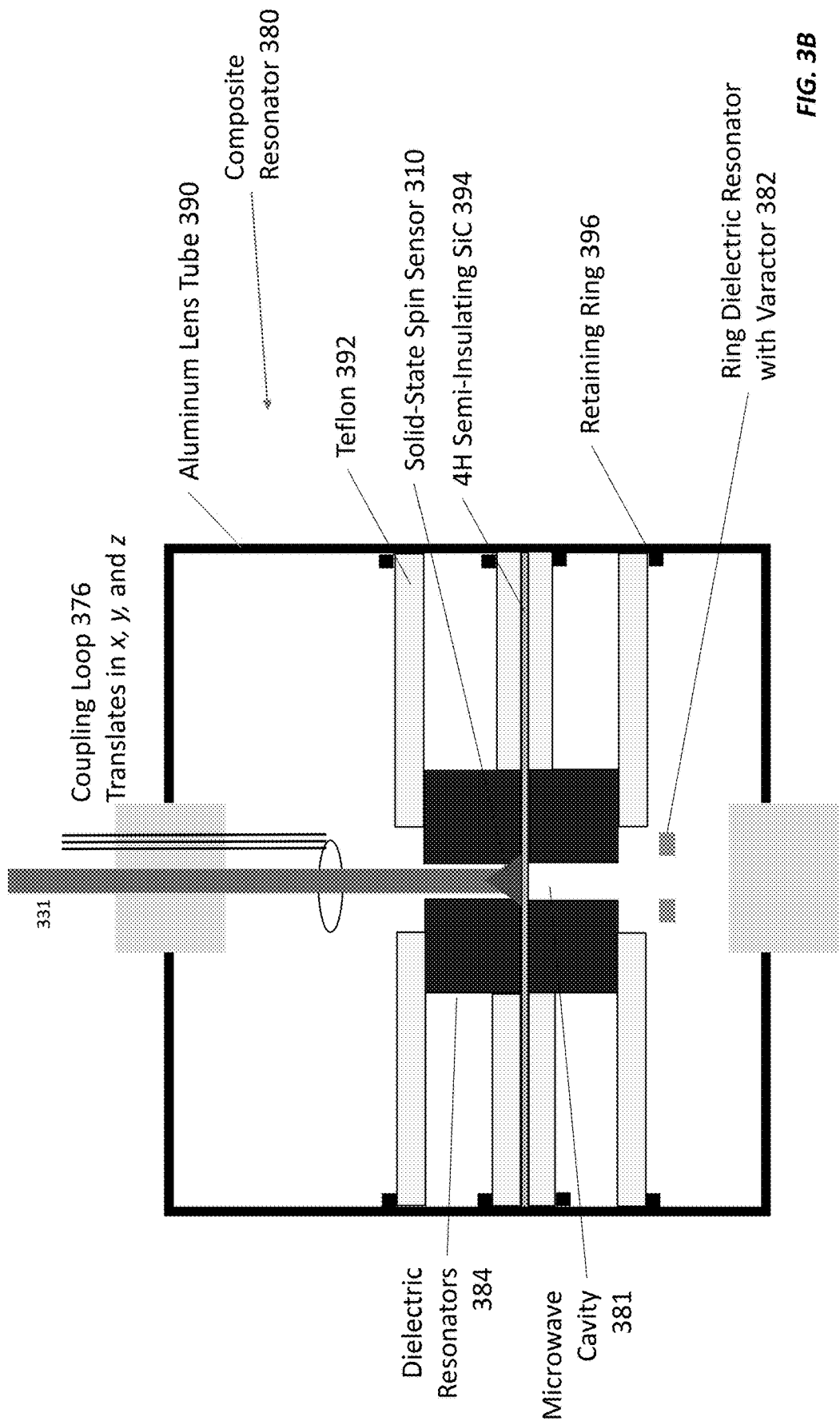
FIG. 3B shows the microwave resonator and solid-state spin sensor of FIG. 3A in greater detail.

FIG. 3B shows a longitudinal cross section of the composite microwave resonator 380. The microwave resonator 380 enhances the interaction between the spin center defects in the solid-state spin sensor 310 and the input microwave radiation. The solid-state spin sensor 310 sits in a microwave cavity 381 formed by dielectric resonators 384, which are sandwiched between Teflon retaining rings 392 and 396 in a housing (aluminum lens tube 390). (The microwave cavity 381 can also be formed by a metallic loop gap resonator or insulating material plated with an electrically conductive material, such as sapphire plated with silver.) The composite microwave resonator 380 can also be composed of planar elements and can be implemented as a split ring resonator, a quarter-wavelength resonator, a patch antenna, or any other suitable microwave resonator. A semi-insulating silicon carbide substrate 394 supports the solid-state spin sensor 380 in the cavity 381 and dissipates heat from the solid-state spin sensor 380.

The input microwave radiation is coupled into the composite microwave resonator 380 by inductive coupling using a wire loop 376 that sticks through a hole in the aluminum lens tube 390 and can be moved in three dimensions. Alternatively, the input microwave radiation can be coupled into the composite microwave resonator 380 by capacitive coupling with a wire loop, end coupling, or any other suitable method of resonator coupling. The pump beam 331 illuminates the solid-state spin sensor 310 via a window or aperture in the aluminum lens tube 390.

Figure 3C:
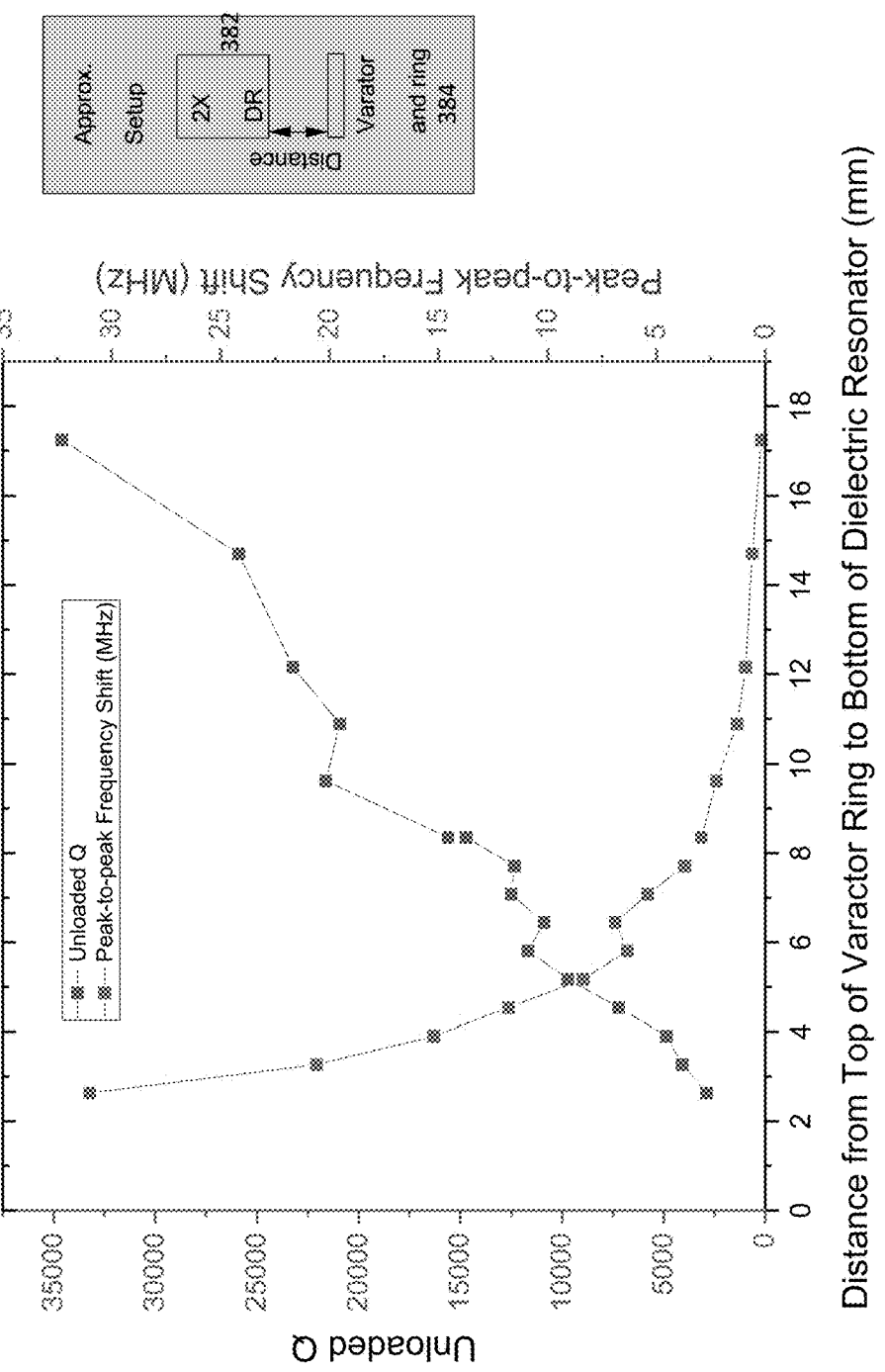
FIG. 3C is a plot of unloaded quality factor (Q; left axis) and peak-to-peak frequency shift (right axis) versus varactor position for the microwave resonator of FIG. 3B.

If desired, an actuator 382, shown in FIG. 3B as a ring coupled to one or more varactors (not shown), can be used to tune the resonance frequency of the composite microwave cavity 380. Moving the ring dielectric resonator and varactor 382 toward or away from the dielectric resonators 384 shifts both the unloaded quality factor (Q) and resonance frequency of the composite microwave resonator 380 as shown in FIG. 3C. Other suitable actuators include piezo-electric elements, tunable capacitors, and switchable capacitor banks that tune the composite microwave resonator's capacitance.

The composite microwave resonator's unloaded quality factor and resonance frequency can also be shifted by changing the composite microwave resonator's inductance. As inductance is typically determined by the physical location of flowing current, the inductance can be changed by changing the geometry or distance of the path traveled by the current, e.g., with a switch that switches the current between different paths.

Applying multiple tones to the actuator (e.g., the dynamically controlled capacitance shown in FIG. 3B) can cause the microwave resonator to be resonant at multiple frequencies simultaneously. When interrogating NVs in diamond, for example, it may be desirable to interrogate some or all of the NV resonances sequentially or simultaneously. For $^{14}$NV, for example, there are 24 resonances thanks to the NVs' four possible orientations in the diamond latter, two possible spin states, and three possible hyperfine states. Shifting or sweeping the resonant frequency of the microwave resonator 380 through these NV resonances, e.g., by applying multiple tones or a frequency chirp to the actuator, makes it possible to interrogate each NV resonance individually.

Microwave Resonator Readout

Figure 4A:
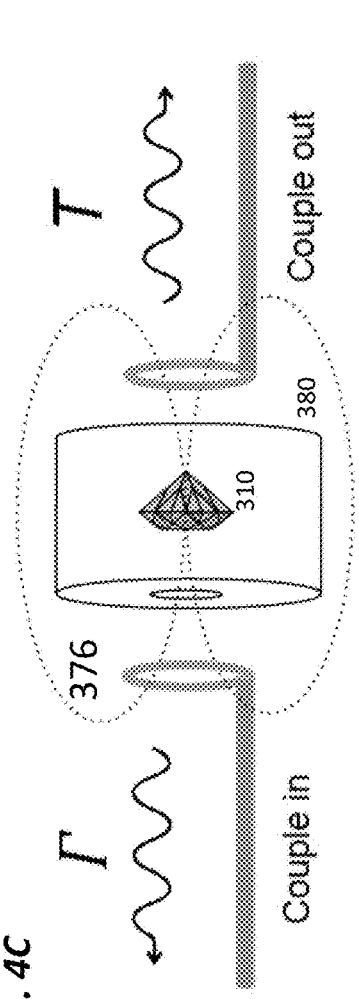
FIG. 4A illustrates quantum spin state transitions for spin defect centers in a solid-state spin sensor with microwave resonator readout.
Figure 4B:
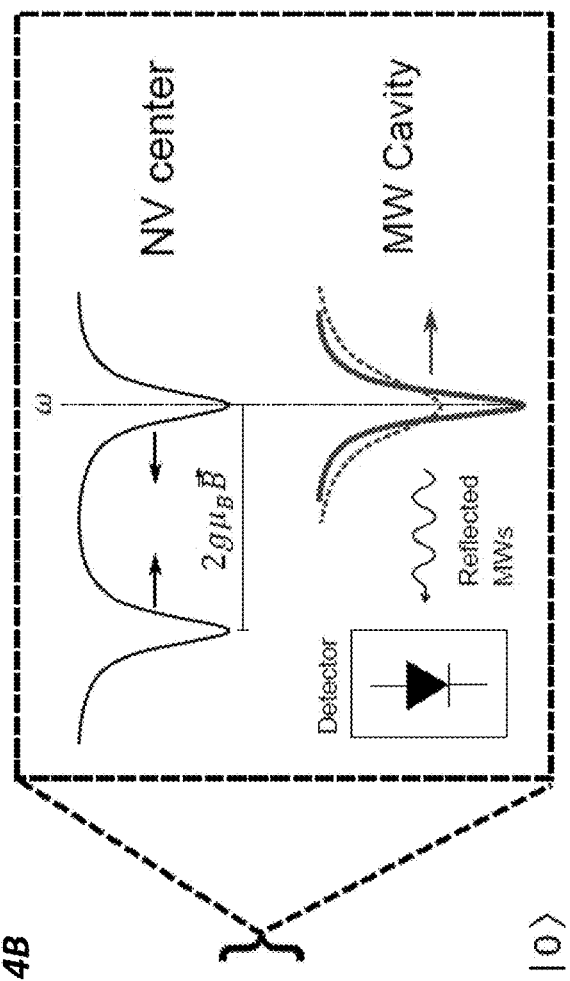
FIG. 4B shows the spin center defect microwave resonances by themselves (top) and the effect of the spins on the microwave resonator quality factor (bottom) for a solid-state spin sensor with microwave resonator readout.
Figure 4C:
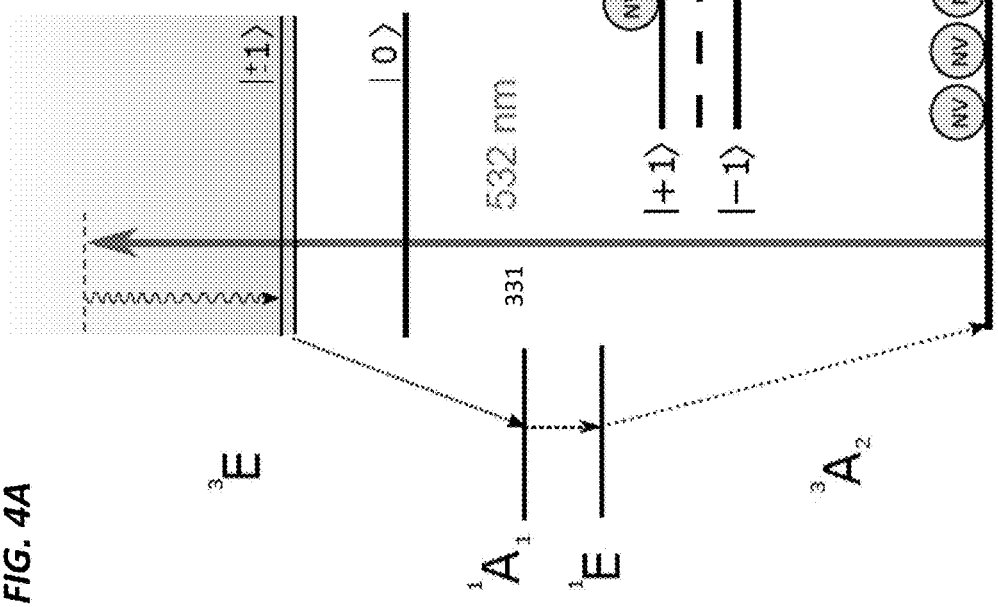
FIG. 4C illustrates input coupling, with voltage reflection coefficient F, and output coupling with voltage transmission coefficient T for microwave radiation probing the quantum spin states of spin defect centers in a solid-state spin sensor in a microwave cavity.

FIGS. 4A-4C illustrate a magnetic field measurement using microwave resonator readout with the solid-state spin sensor system 300 of FIG. 3A. The magnetic field is encoded into the population ratio of the spin defect centers' $|m_s=+1\rangle$, $|m_s=-1\rangle$, and $|m_s=0\rangle$ spin states (assuming the spin system is based on NVs in diamond). The pump laser 330 illuminates the solid-state spin sensor 310 with the pump beam 331, which is at a wavelength of 532 nm and may be modulated in amplitude, phase, and/or frequency by the modulator 332. For example, the modulator 332 may pulse the pump beam 331 on and off. The pump beam 331 re-polarizes the spin defect center population; that is, it changes the distribution of the spin center defects between the different quantum energy levels as shown in the state diagram in FIG. 4A. In this implementation, the pump beam 331 pumps most of the spin center defects into a single quantum state (the $|m_s=0\rangle$ spin state).

The microwave generator 320 irradiates the solid-state spin sensor 310 with input microwave radiation whose spectral content transfers the spin center defect population in the solid-state spin sensor between quantum energy levels. The input microwave radiation should have low phase noise, as phase noise can mimic a magnetic signal. Frequency shifts of the cavity resonance by the magnetic signal and of the microwave radiation due to phase noise both change the amount of microwave radiation reflected from the cavity. It can be very hard to distinguish these two effects, one of which is caused by the magnetic signal and one of which is caused by phase noise. Reducing or suppressing phase noise reduces unwanted variations in the amplitude of the output microwave radiation caused by phase noise.

The spectral content of the input microwave radiation may include one or more frequency tones, with the same or different amplitudes, each of which may be within one, five, or even ten cavity linewidths of the microwave resonator's resonant frequency. The input microwave radiation may be amplitude modulated, frequency modulated, phase modulated, or otherwise altered in time. Like the optional optical radiation, this input microwave radiation interacts with the spin center defects in the solid-state spin sensor 310 and may change the population distribution of the spin center defects between the different quantum states.

For example, the input microwave radiation parameters (frequency and phase or any combination thereof) may be arranged so that spin center defects in one of the quantum states absorb some fraction of the input microwave radiation. This absorption appears as a dip in the solid-state spin sensor's transmission spectrum, which is plotted in the upper trace in FIG. 4B. The transmission spectrum (upper trace in FIG. 4B) has two dips because a bias magnetic field (e.g., applied by the bias magnet 314 in FIG. 3A) overlaps all the $|m_s=+1\rangle$ resonances into one resonance and the $|m_s=0\rangle$ resonances into another resonance. This optional bias magnetic field enhances the interaction between the NVs and the microwave resonator 380.

The dips in the solid-state spin sensor's transmission spectrum can be aligned to the microwave resonator's resonant frequency as shown in the lower trace for FIG. 4B. In addition, the microwave resonator's free spectral range may be chosen to match or mismatch the splitting between the spin center defect resonances, enabling Vernier-style measurements. When the spin defect center population is near or on resonance with the microwave resonator as in FIG. 4B, the microwave resonator's resonance linewidth is broadened due to resonant absorption. This causes the microwave resonator's resonant frequency to be shifted due to scattering and re-emission of microwave photons back into the cavity mode.

Generally, the spectral content of the input microwave radiation should be within a few cavity linewidths of the microwave resonator's resonance frequency. The microwave resonator's resonance frequency can be shifted by the spin center defects by an amount that depends on the physical parameter (e.g., magnetic field) applied to the spin center defects. For example, the microwave resonator 320 may have a resonance with a center frequency at 2.900 GHz and a 200 kHz linewidth. To access this resonance, the input microwave radiation has spectral content between 2.899 GHz and 2.901 GHz (within five resonance linewidths of the resonance center frequency). The spin defect centers may shift the resonance center frequency up to 300 kHz in either direction. This shift of the resonance center frequency imparts a phase and amplitude difference to the microwave radiation reflected from the composite resonator 380.

FIG. 4C shows that the input microwave radiation's interaction with the solid-state spin center 310 and the microwave resonator 380 produces reflected output microwave radiation (F) and transmitted output microwave radiation (T). The difference in power between the input microwave radiation and the total output microwave radiation can be arranged to depend on the number of spin center defects in the quantum state addressed by the input microwave radiation. For example, the input microwave radiation parameters (frequency, phase, or any combination thereof) may be arranged so that spin center defects in one of the quantum states introduce a phase shift (i.e., dispersion) to the input microwave radiation. Upon exiting the cavity, the output microwave radiation has a different phase than in the absence of the spin center defects. The additional shift in phase imparted to the output microwave radiation by the spin center defects corresponds to the number of spin center defects in a particular quantum state.

The coupling loop 376 inductively couples input microwave radiation into the microwave cavity 381; input microwave radiation that isn't coupled into the microwave cavity 381 travels back to the circulator 370 as reflected output microwave radiation. This output microwave radiation is amplified and filtered before being detected by a microwave detector, such as a dual-channel microwave detector. Suitable dual-channel microwave detectors include balanced mixers, dual diode detectors (e.g., a 90-degree hybrid coupler whose outputs are coupled to a pair of balanced Schottky diodes), and I/Q mixers (e.g., the I/Q mixer 380 in FIG. 3A) with the reference microwave radiation input into the radio-frequency (RF) port and the output microwave radiation input into the local oscillator (LO) port or vice versa.

Dual-channel detection is optional but offers substantial advantages over single-channel detection. To start, a dual-channel detector can provide get both phase and amplitude information. Typically, the absorption is encoded in one channel and the dispersion is encoded in the other channel. The dispersive signal is then used as an error signal for locking the microwave frequency locked to the cavity resonance. Dual-channel detection can also be used to suppress or cancel fixed background.

The outputs of the dual-channel microwave detector are passed to one or more analog-to-digital converters (e.g., in the DAQ board 342 in FIG. 3A). The analog-to-digital converters digitize the outputs of the dual-channel microwave detectors and send the results to a computer (e.g., a processor in or coupled to the DAQ board 342). The computer uses the digitized outputs of the dual-channel microwave detector to compute the value of the physical parameter to be measured using the digitized outputs of the dual channel detector. For example, if the dual-channel microwave detector is an I/Q mixer, the outputs of the dual-channel microwave detector are in-phase and quadrature signals that allow the computation of the amplitude and phase differences between the reference microwave radiation and the output microwave radiation. From either the amplitude or phase or amplitude and phase, the computer can determine the value of the physical parameter to be measured.

The processor 360 may also use the digitized outputs of the dual channel microwave detector to modulate, adjust, or otherwise control the input microwave radiation or the optical excitation radiation. For instance, the processor 360 may actuate the pump laser 330, modulator 332, microwave generator 320, first variable attenuator 324, phase shifter 326, or second variable attenuator 328 in FIG. 3A. These components may be controlled to increase or maximize the sensitivity of the device, modify the performance of the device, or for any other purpose.

RLC Equivalent Circuit Model

Without being bound by any particular theory, the solid-state spin sensor and microwave resonator can be described as a classical RLC resonator with lumped element circuit components. These lumped element circuit components change as a result of the interactions between the spin center defects and physical parameter being measured and the coupling between the spin center defects and the microwave resonator. This circuit characterization yields a straightforward computation of the reflection and transmission coefficients for microwave radiation incident on the circuit.

The coupling between the ensemble of spin center defects and the microwave resonator can be modeled with an equivalent circuit for the composite device. The composite device can be described as a series RLC resonator where the coupling between the loop and microwave resonator is represented as a mutual inductance between the magnetic fields of the resonator mode and the coupling loop. In this circuit configuration, the spin defect center ensemble with magnetic susceptibility $\chi$ contributes a net magnetization to the flux through the microwave resonator and consequently modifies the microwave resonator's inductance and equivalent resistance. The spin defect center ensemble susceptibility $\chi$ is complex ($\chi=\chi'-i\chi''$). It includes an imaginary part ($\chi''$) that describes the spin defect centers' absorption of microwave photons and a real part ($\chi'$) that describes dispersion due to the spin defect centers. Separating $\chi$ into its real and imaginary components shows that the series resistance $R_r$ is modified as $R'=R_r(1+Q_0\chi'')$, where $Q_0$ is the microwave resonator's intrinsic quality factor $Q_0=\omega L_r/R_r$, and the series inductance $L_r$ is modified as $L'_r=L_r(1+\chi')$.

TABLE 1 (below) gives the equivalent series RLC circuit parameters calculated using this analysis along with measured quantities of the resonant frequency ($\omega_0/2\pi$), and unloaded quality factor ($Q_0$).

TABLE 1

| Parameters for series RLC equivalent circuit model of the composite resonator | |
|---|---|
| Quantity | Parameter |
| $R_r$ | .00315 Ohms |
| $L_r$ | 3.75 nH |

TABLE 1-continued

| Parameters for series RLC equivalent circuit model of the composite resonator | |
|---|---|
| Quantity | Parameter |
| $C_r$ | .78 pF |
| $\omega_0/2\pi$ | 2.94 GHz |
| $Q_0$ | 22000 |

The series RLC equivalent circuit can be transformed into a parallel RLC equivalent circuit. TABLE 2 (below) gives the equivalent parallel circuit parameters calculated using this analysis along with measured quantities of the resonant frequency ($\omega_0/2\pi$), and unloaded quality factor ($Q_0$).

TABLE 2

| Parameters for parallel RLC equivalent circuit models of the composite resonator | |
|---|---|
| Quantity | Parameter |
| $R_p$ | 1525425 Ohms |
| $L_p$ | 3.75 nH |
| $C_p$ | .78 pF |
| $\omega_0/2\pi$ | 2.94 GHz |
| $Q_0$ | 22000 |

Experimental Magnetic Field Spin Defect Center Microwave Resonator Measurements

The solid-state spin sensor system 300 shown in FIG. 3A was built and used to make simultaneous microwave resonator and ODMR measurements of a magnetic field. The solid-state spin sensor was a commercially available, natural, high-pressure high-temperature (HPHT) treated diamond doped with nitrogen vacancies. The diamond had a particularly high NV density ($>10^{17}/cm^3$ as measured using conventional electron paramagnetic resonance) with a linewidth of y=8 MHz. The diamond was mounted in a hollowed-out cavity machined into a dielectric resonator (DR) stack. The diamond, dielectric resonator stack, and silicon carbide substrate in FIG. 3B had an effective resonant frequency of 2.940 GHz and an unloaded quality factor ($Q_0$) of approximately 22,000. The input and output coupling loops entered an aluminum shield coaxially with the DR stack and allowed for coupling into the resonator $TE_{10\delta}$ mode.

Figure 5:
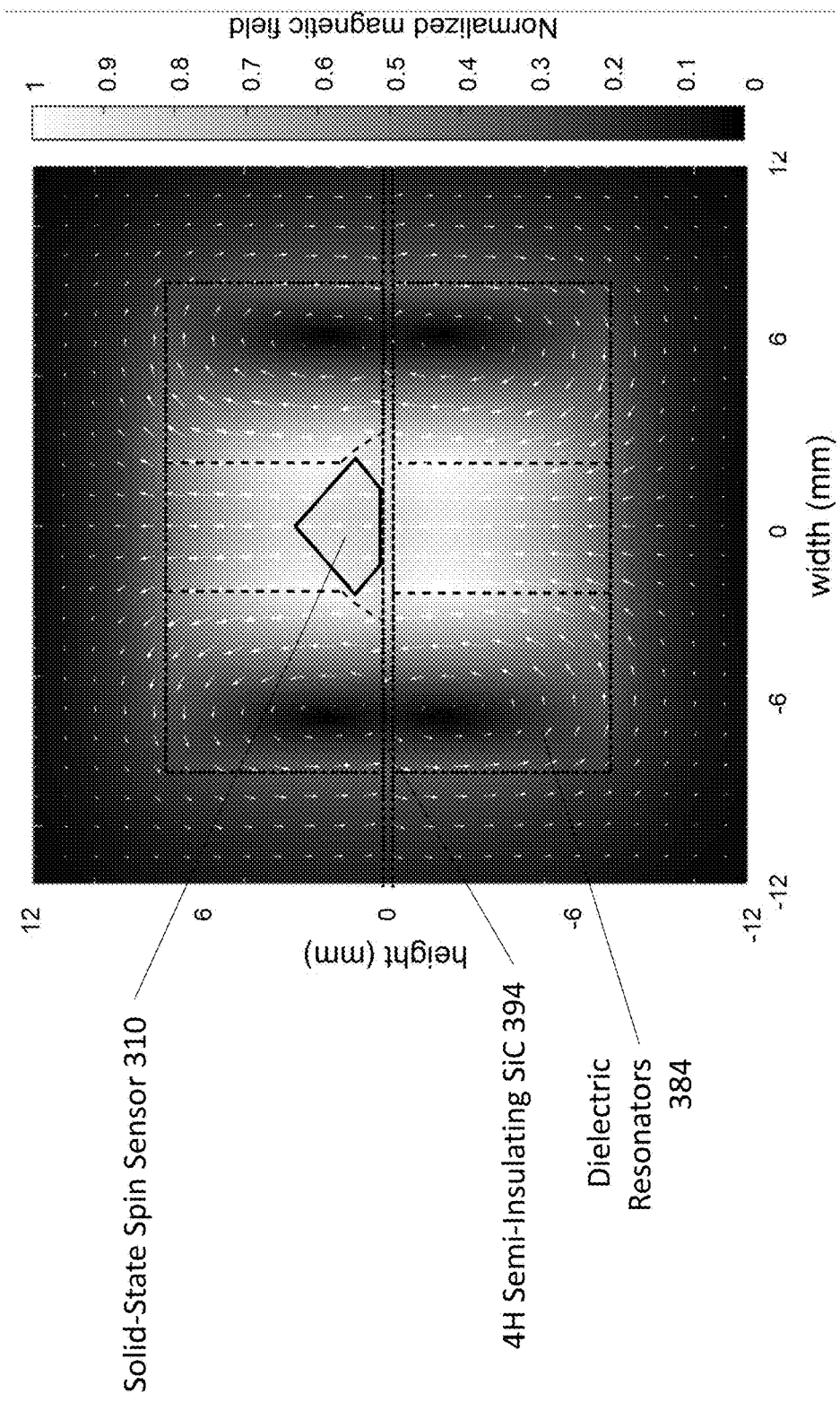
FIG. 5 illustrates an eigenfrequency simulation of a solid-state spin sensor (solid, diamond-shaped outline) in a cavity formed by two dielectric microwave resonators (dashed lines), with arrows showing the 2D vector field distribution.

FIG. 5 shows an eigenfrequency simulation of the DR stack 384 and the solid-state spin sensor 310 (diamond). The resonant frequency ($f_0$=2.940 GHz) and magnetic mode spatial distribution was computed using the Ansys High-Frequency Structure Simulator (HFSS). The black dashed overlay shows the outline of the two dielectric resonators 384 with the diamond 310 placed in the machined cavity. Arrows show the two-dimensional vector field distribution and the shading shows the normalized magnetic field magnitude. The magnetic field of the $TE_{10\delta}$ mode resembles that of a magnetic dipole, with the diamond sitting in a hollowed-out region near the field maxima.

The eigenfrequency simulation in FIG. 5 illustrates the interaction between the microwave radiation and the solid-state spin sensor 310. The solid-state spin sensor 310 is near the point of largest magnetic field in the microwave resonator. This increases or maximizes the interaction between the microwave resonator and the NV spin ensemble in the diamond, making it possible to probe the NV spin ensemble by looking at the properties of the microwave resonator.

The NVs in the NV spin ensemble act like an absorbing medium for the microwaves due to the NV's magnetic resonances. Due to the Kramers Kronig dispersion relations, the NVs also create dispersive shifts for microwaves with frequencies near the magnetic resonances. Put differently, the NVs create both absorption and dispersion for microwaves with frequencies near the magnetic resonances. This effect may be weak but can be enhanced by using a microwave resonator by roughly the quality factor Q of the microwave resonator. (If this were an optical approach, the interaction between the NVs and the resonator would be increased by the cavity finesse). Once the NVs interact strongly with the microwave resonator, the cavity center frequency and quality factor change in response to the NVs' behavior.

With the diamond at the center of the DR stack, laser access was accomplished by machining a cylindrical entry port through the center of the two resonators. Multi-watt laser excitation however caused temperatures in the diamond to rise hundreds of degrees Kelvin, so the diamond was adhered to a 2-inch wafer of semi-insulating silicon carbide (SiC) 394 for heatsinking. This silicon carbide wafer was placed, along with the diamond, between the two DRs in the DR stack. A rare-earth magnet (magnet 314 in FIG. 3A) created a DC bias field $B_0 \neq 6$ G along the $\langle 100 \rangle$ diamond crystallographic axis, resulting in equal projection along all four NV orientations. A test coil (coil 318 in FIG. 3A), positioned coaxially with the rare earth magnet, allowed additional fields to be applied, e.g., for sweeping the applied magnetic field.

The input microwave radiation was generated by a microwave generator and split into reference and signal arms via a directional coupler. The signal arm passed through a circulator that coupled microwave power into and out of the microwave resonator. The circulator separated output microwave radiation reflected by the microwave resonator from the input microwave radiation. The output microwave radiation was consecutively filtered, amplified, and mixed with the reference arm signal to produce an in-phase and quadrature (IQ) signal at DC. The output microwave radiation transmitted by the microwave resonator was read directly from the microwave resonator and digitized after an amplification stage. The microwave resonator readout signal was obtained by fixing the frequency of the input microwave radiation to be on-resonance with the cavity and modulating the amplitude of the bias magnetic field $B_0$ such that the NV Zeeman sublevels swept over the cavity resonance at 2.94 GHz. A photodetector sensed fluorescence emitted by the NVs in the diamond simultaneously.

Figure 6:
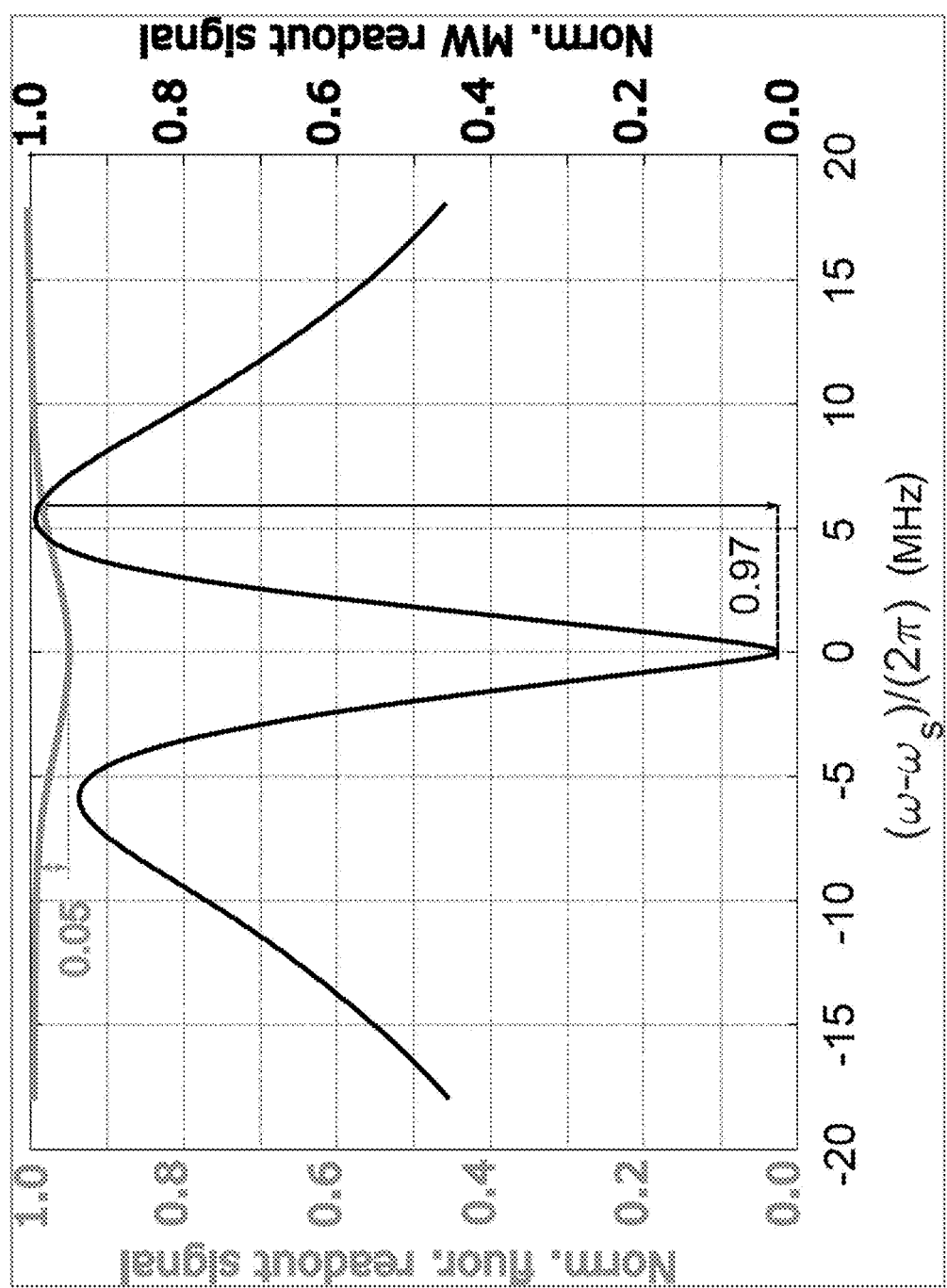
FIG. 6 is a plot of a microwave resonator readout signal (right axis) and superimposed optically detected magnetic resonance (ODMR) signal (left axis) as a function of applied magnetic field.

FIG. 6 shows the microwave resonator readout signal (right axis) and ODMR signal (left axis) as a function of the amplitude of the bias magnetic field $B_0$. The NV ensemble displaced the cavity resonance as a function of the applied bias field and gave a near-unity contrast microwave resonator readout signal. Imperfect isolation between ports 1 and 3 of the circulator caused background microwave photons to reduce the contrast by 3%. This contrast reduction can be mitigated with a higher isolation circulator. The ODMR signal, on the other hand, taken simultaneously and under the same conditions, yielded a contrast of about 5%.

Reflection and Transmission Readout

Figure 7:
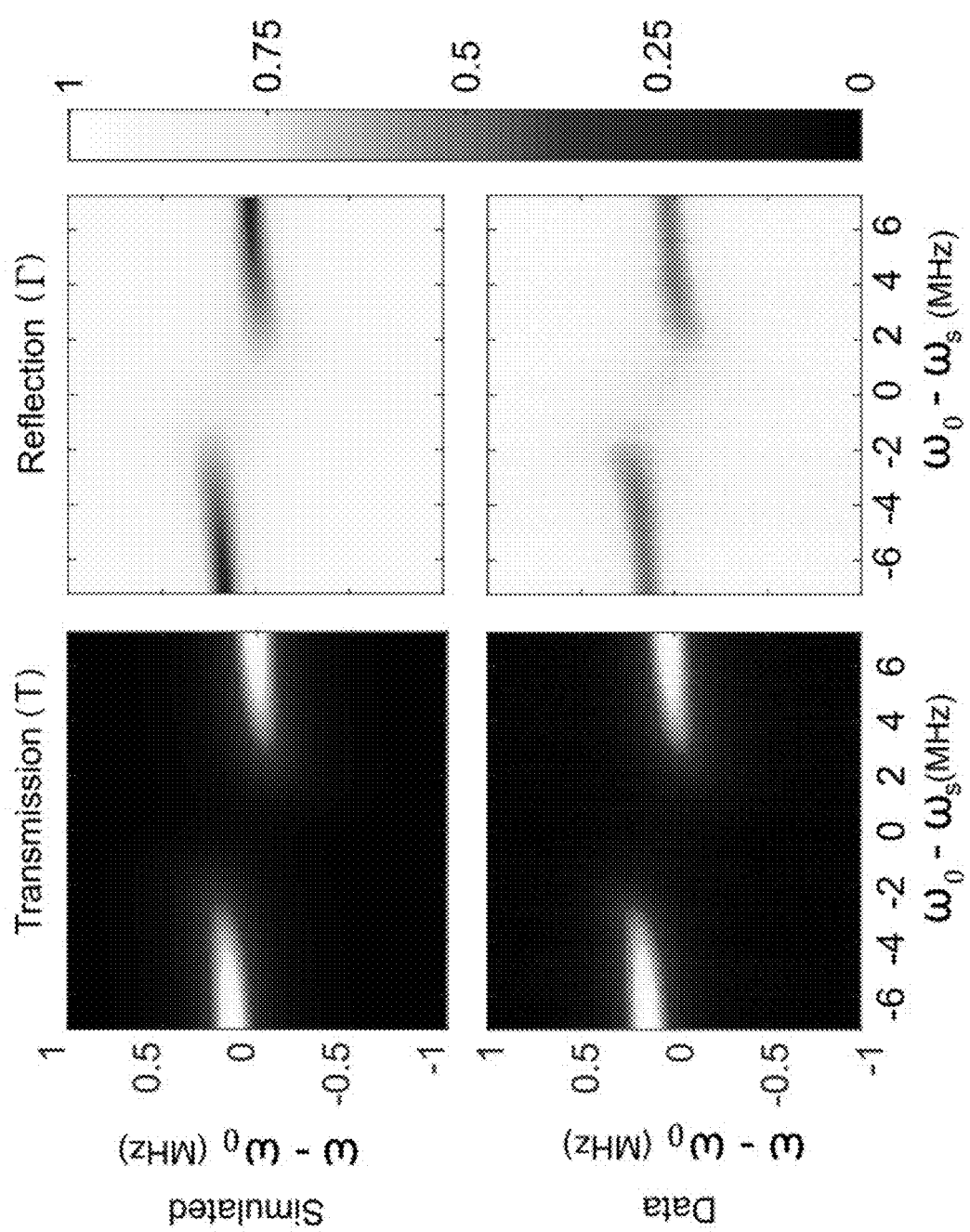
FIG. 7 shows transmission (T) data (left column) and reflection (F) data (right column) for simulated (top row) and experimental (bottom row) microwave resonator readout signals from an inventive solid-state spin sensor.

FIG. 7 shows 2D plots of the drive-cavity ($\delta=\omega-\omega_0$) vs. spin-cavity ($\Delta=\omega_0-\omega_s$) detuning taken by monitoring the reflected and transmitted output microwave radiation under a monotonically increasing DC bias field ($B_0$). The two plots in the top row are simulations of the microwave resonator-NV interaction using the equivalent circuit model described above and fit the data using the static susceptibility $\chi_0$ and the NV $T_1$ and $T_2^*$ as free parameters. The two plots in the bottom row show data taken with −56 dBm of input microwave radiation power supplied to the microwave resonator. At this power level, the input microwave radiation did not saturate the absorptive or the dispersive effects of the microwave resonator-NV interaction. Since the interaction was proportional to the state polarization of the NV ensemble, the pump laser power was set to 18 W at 523 nm.

The plots in FIG. 7 show that the interaction between the NV and the cavity was strongest at zero detuning, where the microwave resonator and NV ensemble have the same resonance frequency (e.g., as shown in the lower trace in FIG. 4B). The absorption and dispersion signal are very visible, resulting in a clear avoided crossing at zero detuning for both transmission and reflection.

The signal to noise ratio (SNR) using microwave resonator readout scales as a function of the input microwave radiation power ($V_{app}$). Ideally, without saturation effects, the reflected signal should scale linearly with this power. However, due to saturation of the $|0\rangle \rightarrow |\pm 1\rangle$ transition, there is a power level above which increased input microwave radiation power yields diminishing returns in the reflected signal ($V_{rms}$). Therefore, the input microwave power level should be chosen to increase or maximize the slope of the reflected signal as a function of the applied bias field $$\frac{dV_{refl}}{dB_0}.$$

Figure 8:
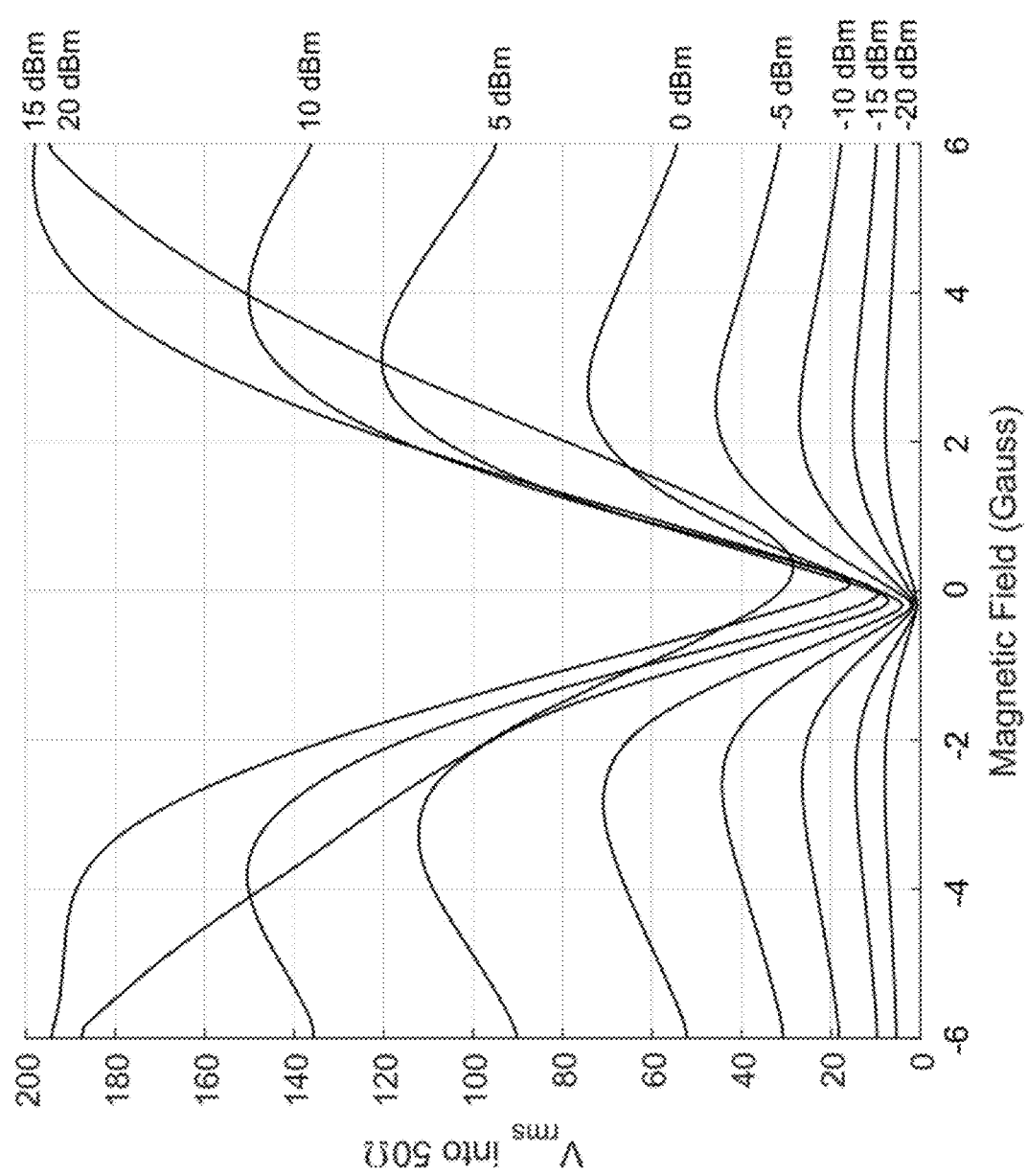
FIG. 8 is a plot of the microwave resonator readout signal from an inventive solid-state spin sensor reflected into a 50Ω impedance at different microwave powers.

FIG. 8 shows microwave resonator readout measured into a 50Ω impedance at different input microwave radiation power levels. The highest slope occurs for an input microwave radiation power level of 15 dBm. The curves in FIG. 8 give an expected Johnson-Nyquist noise limited sensitivity of roughly $$\eta_{JN} \approx \frac{\sqrt{4k_B T R}}{\sqrt{2} \cdot \max\left[\frac{dV_{rms}}{dB_0}\right]},$$

where $k_B$ is the Boltzmann constant, T is the system temperature (in Kelvin), R is the resistance (50Ω), and $B_0$ is the applied magnetic field. The factor of $\sqrt{2}$ arises from the Johnson-Nyquist noise calculation being single-sided in frequency. For 15 dBm of input microwave radiation, the Johnson-Nyquist noise limited sensitivity is 1.08 pT/√Hz.

Figure 9:
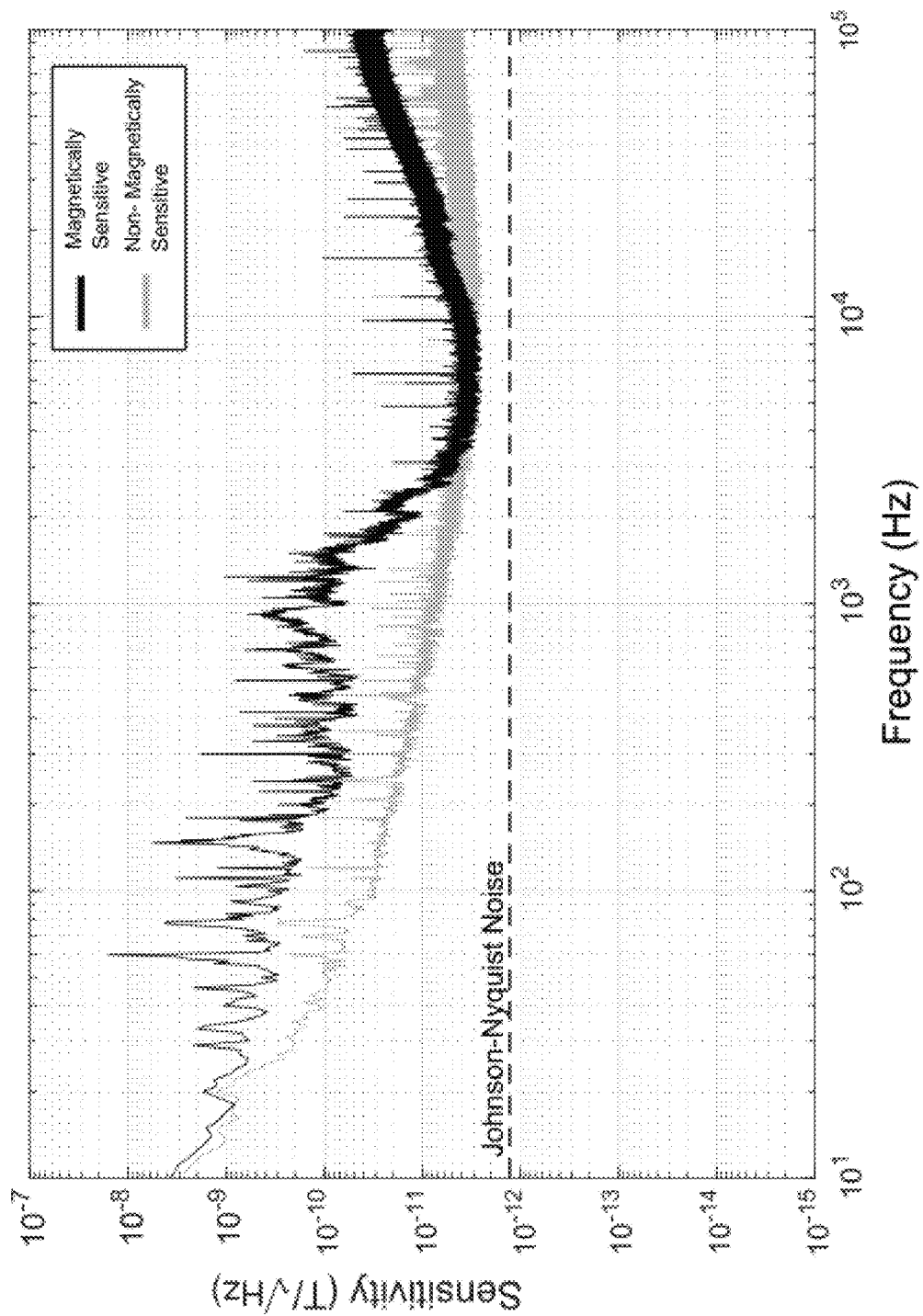
FIG. 9 is a plot of sensitivity versus frequency for a magnetically sensitive channel (upper trace) and a magnetically insensitive channel (lower trace) of an inventive solid-state spin sensor.

FIG. 9 shows the solid-state spin sensor system's magnetic sensitivity for microwave resonator readout as a function of frequency. The spectrum of the magnetically sensitive channel (upper trace) exhibits a minimum power spectral density between 5 and 10 kHz and a sensitivity of 2.6 pT/√Hz using the signal collected at 10 Hz. With a higher readout fidelity (e.g., due to lower phase noise in the microwave source, and stronger resonator-spin-system coupling), the system's sensitivity could reach 1 fT/√Hz or better. In comparison, the best ODMR sensitivity levels bottom out at 1-10 pT/√Hz.

The sensitivity was measured by applying a test magnetic field that varied at 10 Hz and recording the output microwave radiation reflected by the microwave resonator. The microwave resonator and NVs were tuned into the strongly interacting regime (Δ≈0), where the slope of the dispersion signal was at its maximum, with an applied test magnetic field of approximately 1 µT at 10 Hz. This caused the microwave resonator and NVs to experience dispersive and absorptive effects which were separated into the in-phase and quadrature channels of the I/Q mixer. However, due to different saturation behaviors of the dispersion and absorption signals, at 15 dBm of input microwave radiation, the absorption signal was all but suppressed and was effectively not magnetically sensitive. The dispersion channel remains magnetically sensitive for much higher microwave powers. Tuning the phase of the reference arm isolated the dispersion signal and adjusting the frequency of the input microwave radiation increased the SNR of the dispersion signal.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize or be able to ascertain, using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A sensor system comprising:
   a microwave resonator;
   a solid-state host electromagnetically coupled to the microwave resonator and containing spin defect centers;
   a microwave radiation source, in electromagnetic communication with the microwave resonator and the spin defect centers, to apply microwave radiation to the microwave resonator and the spin defect centers, the microwave resonator enhancing the interaction between the microwave radiation and the spin defect centers; and
   a detector, in electromagnetic communication with the microwave resonator and the spin defect centers, to measure an amplitude and/or a phase of the microwave radiation exiting the microwave resonator after interacting with the spin defect centers.

2. The sensor system of claim 1, wherein the detector is configured to sense a change in the amplitude and/or the phase of the microwave radiation in response to a shift in resonant frequencies of the spin defect centers caused by a physical parameter applied to the spin defect centers.

3. The sensor system of claim 1, wherein the detector is a homodyne sensor with a reference arm.

4. The sensor system of claim 1, wherein the detector is a heterodyne detector configured to encode information, at a heterodyne frequency, about a physical parameter that shifts resonance frequencies of the spin defect centers.

5. The sensor system of claim 1, further comprising:
   an optical excitation source, in optical communication with the spin defect centers, to excite the spin defect centers to a desired quantum state.

6. The sensor system of claim 1, further comprising:
   a processor, operably coupled to the detector, to determine a physical parameter experienced by the spin defect centers based on the amplitude and/or the phase of the microwave radiation.

7. The sensor system of claim 6, wherein the microwave radiation source is configured to vary the microwave radiation based on the physical parameter determined by the processor.

8. The sensor system of claim 6, wherein the processor is configured to determine quantum states of the spin defect centers based on the amplitude and/or phase of the microwave radiation.

9. The sensor system of claim 1, further comprising:
   an actuator, operably coupled to the microwave resonator, to vary a resonant frequency of the microwave resonator.

10. The sensor system of claim 9, wherein the actuator comprises at least one of a piezo-electric element, a varactor, a tunable capacitor, or a switchable capacitor bank.

11. The sensor system of claim 9, wherein the actuator is configured to change the resonant frequency of the microwave resonator by varying a capacitance.

12. The sensor system of claim 9, wherein the actuator is configured to change a resonant frequency of the microwave resonator by varying an inductance.

13. The sensor system of claim 9, wherein applying multiple tones to the actuator causes the microwave resonator to be resonant at multiple frequencies simultaneously.

14. The sensor system of claim 9, wherein the actuator comprises a dynamically controlled capacitance configured to allow the microwave resonator to be resonant at multiple frequencies simultaneously.

15. A method of measuring a physical parameter with a microwave resonator containing a solid-state host, the method comprising:
   subjecting spin defect centers in the solid-state host to the physical parameter, the physical parameter causing a shift in resonance frequencies of the spin defect centers with respect to a resonance frequency of the microwave resonator;
   probing the shift in the resonance frequencies of the spin defect centers with respect to the resonance frequency of the microwave resonator with a microwave waveform;
   measuring the microwave waveform transmitted and/or reflected from the microwave resonator and the spin defect centers; and
   determining an amplitude and/or a direction of the physical parameter based on the microwave waveform transmitted and/or reflected from the microwave resonator and the spin defect centers.

16. The method of claim 15, wherein measuring the microwave waveform comprises measuring in-phase and quadrature components of the microwave waveform.

17. The method of claim 15, wherein measuring the microwave waveform comprises sensing the shift in the resonance frequencies of the spin defect centers with respect to the resonance frequency of the microwave resonator with a contrast ratio of at least 95%.

18. The method of claim 15, wherein determining the amplitude and/or the direction of the physical parameter comprises measuring the physical parameter with a readout fidelity of at least 0.1.

19. A magnetic field sensor comprising:
   a resonant circuit comprising:
      a microwave resonator;
      a solid-state host in proximity to the microwave resonator, the solid-state host having spin defect centers that shift a resonance frequency of the microwave resonator in response to an external magnetic field;
   a microwave source, in electromagnetic communication with the resonant circuit, to probe the resonance frequency of the microwave resonator with microwave radiation;
   a microwave detector, in electromagnetic communication with the microwave resonator, to detect the microwave radiation that probes the resonance frequency of the microwave resonator; and
   a processor, operably coupled to the microwave detector, to determine a magnitude and/or a direction of the external magnetic field based on the microwave radiation detected by the detector.

20. The magnetic field sensor of claim 19, wherein the external magnetic field changes a population distribution of the spin defect centers among different quantum states.

21. The magnetic field sensor of claim 19, wherein the microwave detector is configured to detect in-phase and quadrature components of the microwave radiation.

22. The magnetic field sensor of claim 19, further comprising:
   locking circuitry, operably coupled to the microwave source and the microwave detector, to lock a spectral component of the microwave radiation to the resonance frequency of the microwave resonator.

* * * * *